(12) United States Patent
Hatakeyama

(10) Patent No.: US 6,995,469 B2
(45) Date of Patent: Feb. 7, 2006

(54) SEMICONDUCTOR APPARATUS AND FABRICATING METHOD FOR THE SAME

(75) Inventor: Tomoyuki Hatakeyama, Hachioji (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 10/819,801

(22) Filed: Apr. 7, 2004

(65) Prior Publication Data

US 2004/0232533 A1 Nov. 25, 2004

(30) Foreign Application Priority Data

May 21, 2003 (JP) ............................. 2003-143379

(51) Int. Cl.
*H01L 23/48* (2006.01)
*H01L 23/52* (2006.01)
(52) U.S. Cl. ............... 257/738; 257/737; 257/734; 257/780; 228/180.22
(58) Field of Classification Search ........... 257/737, 257/734, 780, 772, 786; 280/180.22
See application file for complete search history.

(56) References Cited

U.S. PATENT DOCUMENTS

| | | | |
|---|---|---|---|
| 5,090,119 A * | 2/1992 | Tsuda et al. ................... 29/843 |
| 5,786,271 A | 7/1998 | Ohida et al. |
| 6,297,562 B1 * | 10/2001 | Tilly .......................... 257/780 |
| 6,311,888 B1 * | 11/2001 | Funada et al. ............... 228/106 |
| 6,335,571 B1 * | 1/2002 | Capote et al. ............... 257/787 |
| 6,344,695 B1 * | 2/2002 | Murayama .................... 257/781 |
| 6,590,287 B2 * | 7/2003 | Ohuchi ........................ 257/738 |
| 6,798,072 B2 * | 9/2004 | Kajiwara et al. ........... 257/778 |
| 2001/0026015 A1 * | 10/2001 | Ikegami et al. ............. 257/701 |
| 2002/0153608 A1 * | 10/2002 | Okada et al. ................ 257/737 |

\* cited by examiner

*Primary Examiner*—Jasmine Clark
(74) *Attorney, Agent, or Firm*—Scully, Scott, Murphy & Presser

(57) ABSTRACT

This conductor apparatus mounts through a bump a semiconductor chip having an electrode pad on a circuit board having a connection pad at a position opposite to the electrode pad. The bump comprises a first protruding electrode provided on the electrode pad, a second protruding electrode provided on the connection pad, and an electroconductive connection member which integrally covers peripheral surfaces of the first and second protruding electrodes and solid-phase-diffusion-connects these protruding electrodes.

16 Claims, 7 Drawing Sheets

US 6,995,469 B2

SEMICONDUCTOR APPARATUS AND FABRICATING METHOD FOR THE SAME

CROSS-REFERENCE TO RELATED APPLICATIONS

This application is based upon and claims the benefit of priority from prior Japanese Patent Application No. 2003-143379, filed May 21, 2003, the entire contents of which are incorporated herein by reference.

BACKGROUND OF THE INVENTION

1. Field of the Invention

The present invention relates to a semiconductor apparatus and a fabricating method for the same.

2. Description of the Related Art

In order to realize a reduction in size of electronic devices, a development in a high-density packaging technique which improves the packaging density of semiconductor apparatuses is important. As a high-density packaging technique which is considered to be most effective, there is a flip chip packaging method which connects a semiconductor chip with an electrode of a circuit board through a bump.

The flip chip packaging method can reduce the packaging area to a size substantially equivalent to that of a semiconductor chip in order to complete the connection between a semiconductor chip to be mounted and a circuit board in a main plane.

Jpn. Pat. No. 3297254 (corresponding to U.S. Pat. No. 5,786,271) discloses a semiconductor package using such flip chip packaging and a fabricating method for the same. As shown in FIG. 18, the semiconductor package disclosed in this publication comprises a substrate 2 including on one main surface a wiring portion having a protruding electrode 2b provided on a conductor terminal 2a surface, a semiconductor chip 1 connected/mounted in a face-down manner with a protruding electrode 1b provided on an electrode pad 1a surface being associated with the protruding electrode 2b of this substrate 2, a sealing resin layer 3 which fills the gap between the lower surface of the semi-conductor chip 1 and the upper surface of the substrate 2, and a planar external connection terminal 2c which is electrically connected with the wiring portion of the-substrate 2 and led/exposed to the other main-surface side. The protruding electrode 2b of the substrate 2 is solid-phase-diffusion-connected with the protruding electrode 1b of the semiconductor chip 1. Here, the solid phase diffusion connection means that giving a plastic deformation to a boundary surface of the same type or different types of metals facilitates destruction of an oxidized coating and activation of the surface in a bonded portion, and both metals are diffused and bonded when new surfaces are brought into contact with each other.

Further, the semiconductor package in this publication is manufactured by a step of forming the protruding electrode 2b on the conductor terminal 2a surface of the substrate 2, a step of forming the protruding electrode 1b on the electrode pad 1a surface of the semiconductor chip 1, a step of positioning/arranging the protruding electrode 1b of the semiconductor chip 1 in accordance with the protruding electrode 2b of the substrate 2, a step of pressurizing the protruding electrodes 1 b and 2b of the substrate 2 and the semiconductor chip 1 which are positioned and subjecting them to diffusion connection, a step of filling a sealing resin in the gap formed by the upper surface of the substrate 2 and the lower surface of the semiconductor chip 1 which are diffusion-connected with each other, and a step of forming a sealing resin layer 3 by hardening the filled sealing resin.

BRIEF SUMMARY OF THE INVENTION

A first aspect of the present invention is directed to a semiconductor apparatus which mounts through a bump a semiconductor chip having an electrode pad on a circuit board having a connection pad at a position opposite to the electrode pad, wherein the bump comprises: a first protruding electrode provided on the electrode pad; a second protruding electrode provided on the connection pad; and an electro-conductive connection member which integrally covers peripheral surfaces of the first and second protruding electrodes and solid-phase-diffusion-connects the first and second protruding electrodes.

A second aspect of the present invention is directed to the semiconductor apparatus according to the first aspect of the present invention, wherein a bulk modulus of the connection member is preferably smaller than a bulk modulus of each of the first and second protruding electrodes.

A third aspect of the present invention is directed to the semiconductor apparatus according to the second aspect of the present invention, wherein the connection member preferably solid-phase-diffusion-connects the first and second-protruding electrodes together with the electrode pad and the connection pad.

A fourth aspect of the present invention is directed-to the semiconductor apparatus-according-to the second aspect of the present invention, wherein preferably the first protruding electrode is not opposite to the second protruding electrode.

A fifth aspect of the present invention is directed to the semiconductor apparatus according to the second aspect of the present invention, wherein a top portion of the first protruding electrode is preferably opposite to and in contact with a top portion of the second protruding electrode.

A sixth aspect of the present invention is directed to the semiconductor apparatus according to the second aspect of the present invention, wherein a connection surface of the connection member on which the first and second protruding electrodes are connected with each other preferably has a flat shape.

A seventh aspect of the present invention is directed to the semiconductor apparatus according to the first aspect of the present invention, wherein the connection member preferably solid-phase-diffusion-connects the first and second protruding electrodes together with the electrode pad and the connection pad.

An eighth aspect of the present invention is directed to the semiconductor apparatus according to the first aspect of the present invention, wherein preferably the first protruding electrode is not opposite to the second protruding electrode.

A ninth aspect of the present invention is directed to the semiconductor apparatus according to the first aspect of the present invention, wherein preferably a top portion of the first protruding electrode is opposite to and in contact with a top portion of the second protruding electrode.

A 10th aspect of the present invention is directed to the semiconductor apparatus according to the first aspect of the present invention, wherein a connection surface of the connection member on which the first and second protruding electrodes are connected preferably has a flat shape.

An 11th aspect of the present invention is directed to a semiconductor apparatus which mounts through a bump a semiconductor chip which has an electrode pad on a circuit board which has a connection pad at a position opposite to the electrode pad, wherein the bump comprises: a first protruding electrode provided to the electrode pad; a second protruding electrode provided to the connection pad; and electroconductive connecting means for integrally covering peripheral surfaces of the first and second protruding electrodes, and solid-phase-diffusion-connecting the first and second protruding electrodes with each other.

A 12th aspect of the present invention is directed to the semiconductor apparatus according to the 11th aspect of the present invention, wherein a bulk modulus of the connecting means is preferably smaller than a bulk modulus of each of the first and second protruding electrodes.

A 13th aspect of the present invention is directed to the semiconductor apparatus according to the 11th aspect of the present invention, wherein the connecting means preferably solid-phase-diffusion-connects the first and second protruding electrodes together with the electrode pad and the connection pad.

A 14th aspect of the present invention is directed to the semiconductor apparatus according to 11th aspect of the present invention, wherein preferably the first protruding electrode is not opposite to the second protruding electrode.

A 15th aspect of the present invention is directed to the semiconductor apparatus according to the 11th aspect of the present invention, wherein preferably a top portion of the first protruding electrode is opposite to and in contact with a top portion of the second protruding electrode.

A 16th aspect of the present invention is directed to the semiconductor apparatus according to the 11th aspect of the present invention, wherein a connection surface of the connecting means on which the first and second protruding electrodes are connected has a flat shape.

A 17th aspect of the present invention is directed to a fabricating method for a semiconductor apparatus, comprising: a step of forming a first protruding electrode on an electrode pad of a semiconductor chip; a step of forming a second protruding electrode on a connection pad of a circuit board; a step of aligning and arranging an electroconductive connection member at a position opposite to the electrode pad or the connection pad; a step of positioning the connection member and the first protruding electrode and then performing solid phase diffusion connection so as to integrally cover a peripheral surface of the second protruding electrode.

An 18th aspect of the present invention is directed to the fabricating method for a semiconductor apparatus according to the 17th aspect of the present invention, wherein the method preferably further comprises a step of flattening a connection surface of the connection member after the step of aligning and arranging the connection member at a position opposite to the electrode pad or the connection pad.

A 19th aspect of the present invention is directed to the fabricating method for a semiconductor apparatus according to the 17th aspect of the present invention, wherein the electroconductive connection member has a spherical shape.

A 20th aspect of the present invention is directed to the fabricating method for a semiconductor apparatus according to the 17th aspect of the present invention, wherein the solid phase diffusion connection is preferably performed in a vacuum or an inert gas.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 3A and 3B are views illustrating the structure of the first embodiment according to the present invention, wherein FIG. 3A is a view of an MEMS board 4 after forming protruding electrodes seen from a lower surface direction in FIG. 2 and FIG. 3B is a view of a circuit board 6 after forming protruding electrodes seen from an upper surface direction in FIG. 2;

DETAILED DESCRIPTION OF THE INVENTION

Embodiments according to the present invention will now be described hereinafter with reference to the accompanying drawings.

[First Embodiment]

A first embodiment is an application to an example wherein an electrostatic drive type device is packaged by flip-chip-connecting an MEMS board as a semi-conductor chip having a movable portion on a large part of the substrate with a circuit board having a drive electrode corresponding with the movable portion.

(Structure)

Figure 1:
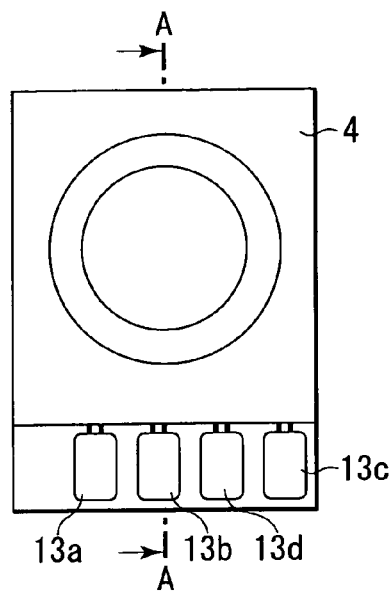
FIG. 1 is a view illustrating a structure of a first embodiment according to the present invention, and it is a top view of an electrostatic drive type device after packaging seen from the right above.
Figure 2:
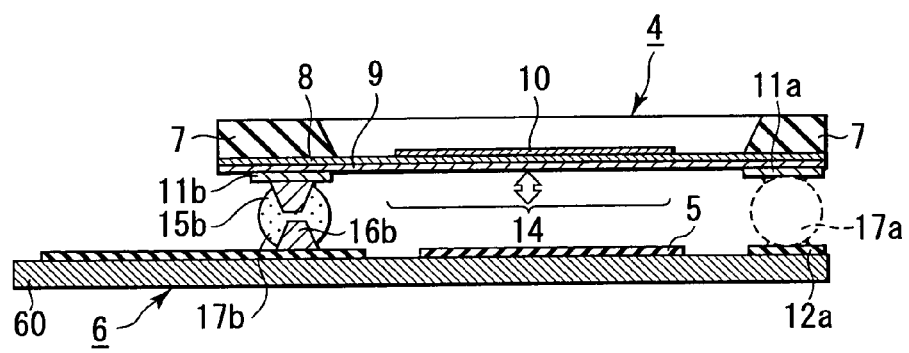
FIG. 2 is a view illustrating the structure of the first embodiment according to the present invention, and it is a cross-sectional view taken along the part A—A in FIG. 1.
Figure 3A:
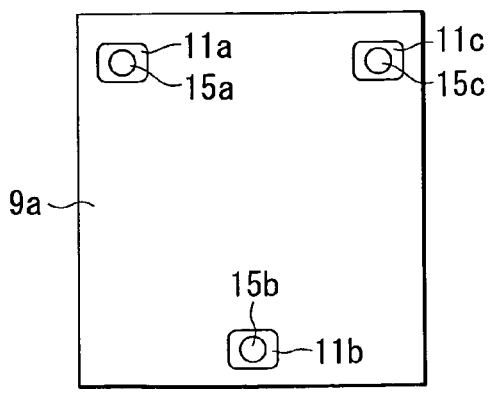
Figure 3B:
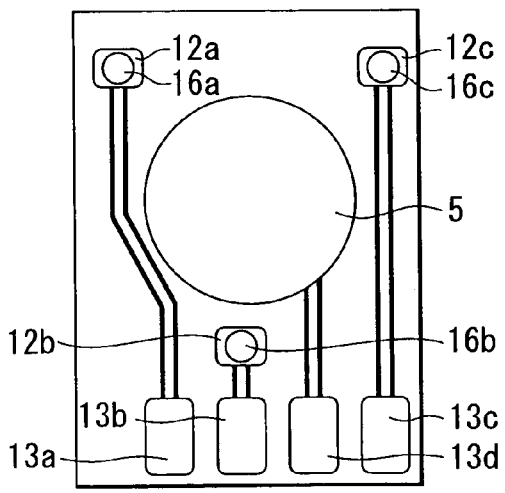

FIGS. 1 to 3B are views illustrating a structure of the first embodiment according to the present invention. FIG. 1 is a top view of the electrostatic drive type device after packaging seen from the right above; FIG. 2, a cross-sectional view taken along the part A—A in FIG. 1; FIG. 3A is a view of the MEMS board 4 after forming protruding electrodes seen from a lower surface direction in FIG. 2; and FIG. 3B is a view of the circuit board 6 after forming protruding electrodes seen from an upper surface direction in FIG. 2.

The first embodiment is configured as follows. The MEMS board 4 comprises a single-crystal silicon frame 7 whose central portion is eliminated by etching, a polyimide thin film 8 and a Cr thin film 9 which are formed on an entire lower surface of this frame 7, an Al reflection film 10 circularly formed on the polyimide thin film 8, and Au electrode pads 11a, 11b and 11c formed at three positions directly below the frame on the Cr thin film 9. A movable portion 14 bends in a direction of the circuit board 6 by electrostatic attraction.

On the other hand, the circuit board 6 comprises a substrate 60, an Al drive electrode 5 formed at a position opposite to the Al reflection film 10, Al connection pads 12a, 12b and 12c formed at positions opposite to the electrode pads 11a, 11b and 11c, and external connection terminals 13a, 13b, 13c and 13d electrically connected with the drive electrode 5 and the connection pads 12a to 12c through wirings. The respective elements are all provided on an upper surface of the substrate 60.

Au bumps 15a to 15c as protruding electrodes are provided to the electrode pads 11a to 11c on the MEMS board 4 and Au bumps 16a to 16c as protruding electrodes are provided on the connection pads 12a to 12c on the circuit board 6 by a stud bump method. The Au bumps 15a to 15c and the Au bumps 16a to 16c all have the same conical shape. In regard to their size, a bottom surface diameter is 60 to 100 $\mu$m, and a top surface diameter is 20 to 50 $\mu$m. Although each of the Au bumps 15a to 15c is provided on each of the electrode pads 11a to 11c and the connection pads 12a to 12c in this embodiment, two or more bumps may be provided if possible, and not all the bumps have to have the same shape.

Sn—Bi solders 17a to 17c as metal electrodes integrally cover the Au bumps 15a to 15c and the Au bumps 16a to 16c, and form alloy layers and mechanically/electrically connect the same by using the respective Au bump peripheral surfaces and the solid phase diffusion connection. A material of the Sn—Bi solders 17a to 17c is a low-temperature solder having 42% of Sn and 58% of Bi, has a bulk modulus lower than that of each of the Au bumps 15a to 1-5c and the Au bumps 16a to 16c, and can be readily plastic-deformed.

In regard to a combination of the protruding electrodes and the metal electrodes, the Sn—Bi solders do not have to be used as long as a material of the metal electrodes can easily cause plastic deformation as compared with a material of the protruding electrodes. If the protruding electrodes are the Au bumps, any other solder alloy such as Sn—Zn or Sn—In, Al, Sn and others may be used as the metal electrodes. Further, the material of the protruding electrodes is not restricted to Au, and any material with a large bulk modulus such as Ni or Cu can suffice.

(Effects)

A fabricating method according to this embodiment will now be described with reference to FIGS. 4 to 9. In the drawings, (S1) to (S6) denote respective fabricating steps.

Figure 4:
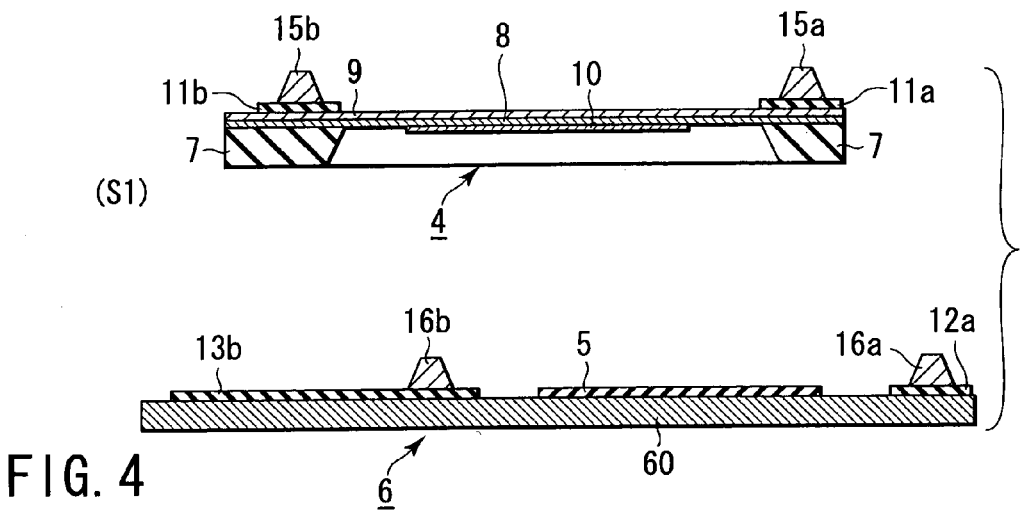
FIG. 4 is a view (part 1) illustrating a fabricating method according to the first embodiment of the present invention.

(S1) First, as shown in FIG. 4, the Au bumps 15a to 15c are formed on the electrode pads 11a to 11c of the MEMS board 4 by the stud bump method. The Au bumps 16a to 16c are likewise formed on the connection pads 12a to 12c of the circuit board 6 by the stud bump method. Any of the step of forming the Au bumps 15a to 15c and the step of forming the Au bumps 16a to 16c can be performed first. Furthermore, although the Au bumps are formed by the stud bump method using Au wires as a material in this embodiment, they may be formed by a plating method.

Figure 5:
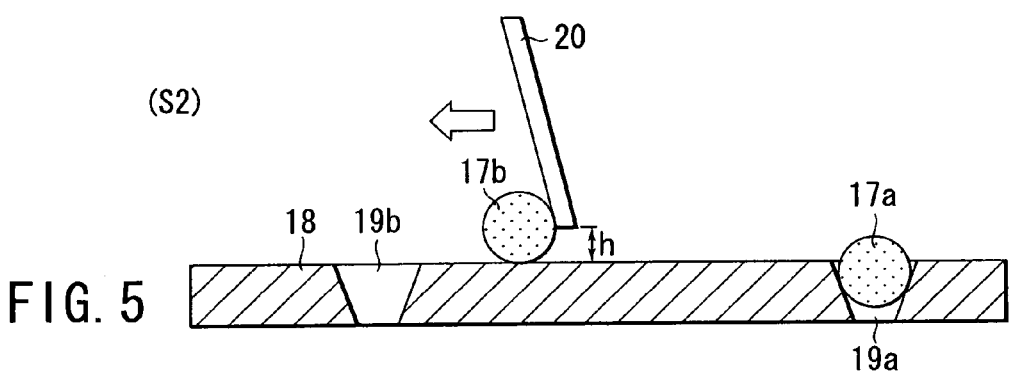
FIG. 5 is a view (part 2) illustrating the fabricating method according to the first embodiment of the present invention.

(S2) Then, as shown in FIG. 5, the Sn—Bi solders 17a to 17c are aligned at positions corresponding to the electrode pads of the MEMS board 4 by using a ball aligning jig 18 formed of Ni/Co having holes 19a to 19c in inverted conical forms. The ball aligning jig 18 is fixed to a base (not shown) by screwing (not shown).

After three or more spherical Sn—Bi solders 17a to 17c larger than the bottom surface diameter of each of the Au bumps 15a to 15c and 16a to 16c are mounted on the upper surface of the ball aligning jig 18, a metal squeegee 20 is moved in a horizontal direction relative to the upper surface of the ball aligning jig 18 in such a manner that the Sn—Bi solders 17a to 17c are inserted into all the holes 19a to 19c.

At this time, in order to avoid damage to the Sn—Bi solders 17a to 17c inserted to the holes 19a to 19c due to a contact with the metal squeegee 20, the distance h between a lower end of the metal squeegee 20 and an upper surface of the ball aligning jig 18 is adjusted so as to satisfy the following relationship:

Diameter of each of the Sn—Bn solders 17a to 17c >h >Height in which the Sn—Bi solders 17a to 17c inserted to the holes 19a to 19c are exposed from the upper surface of the ball aligning jig 18. Moreover, since each of the Sn—Bi solders 17a to 17c is a small ball having a diameter of 35 to 400 $\mu$m, a material of the metal squeegee 20 is a metal such as Al in order to prevent the Sn—Bi solders 17a to 17c from electro-statically adhering to the metal squeegee 20 during alignment.

(S3) Subsequently, the MEMS board 4 having the Au bumps 15a to 15c provided thereto and the Sn—Bi solders 17a to 17c are positioned in the horizontal direction. That is, the rear surface of the MEMS board 4 is held by vacuum suction using a pressure welding head 21 in a packaging machine, and a position of the MEMS board 4 is adjusted in such a manner that the Au bumps 15a to 15c are opposite to the Sn—Bi solders 17a to 17c.

Figure 6:
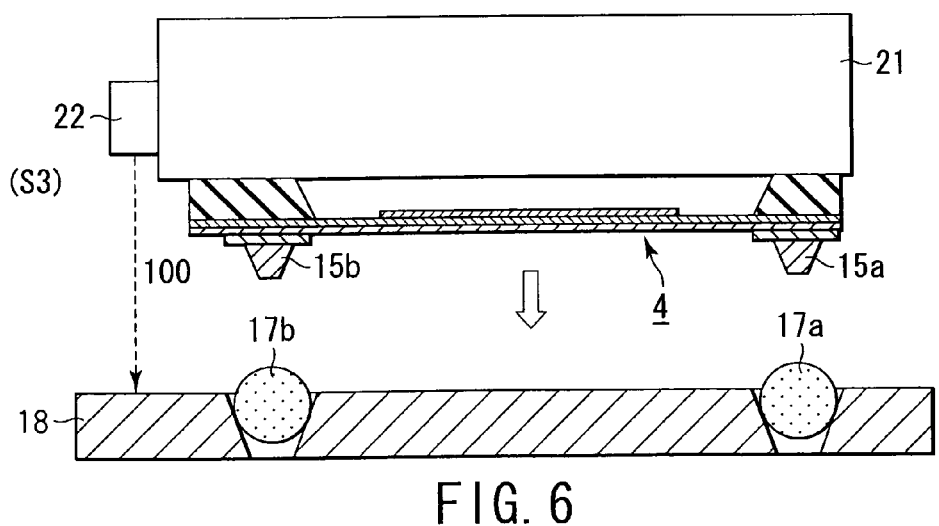
FIG. 6 is a view (part 3) illustrating the fabricating method according to the first embodiment of the present invention.

Then, as shown in FIG. 6, the pressure welding head 21 is moved down in a vertical direction, and an operation to press-fit the Au bumps 15a to 15c to the Sn—Bi solders 17a to 17c is started. At this time, a distance between the upper surface of the ball aligning jig 18 and the pressure welding head 21 is detected by a vertical length measuring sensor 22 provided on a side surface of the pressure welding head 21. In this detection, light beams 100 are used. As a result, a quantity of press-fitting the Au bumps 15a to 15c to the Sn—Bi solders 17a to 17c can be controlled.

Before press-fitting the Au bumps 15a to 15c to the Sn—Bi solders 17a to 17c, either the Au bumps 15a to 15c or the Sn—Bi solders 17a to 17c are heated to a temperature which enables the solid phase diffusion connection in advance. In the heating method, a ceramic heater (not shown) is set on the pressure welding head 21 or in a base (not shown), and indirect heating is carried out through the MEMS board 4 or the circuit board 6.

As a preheating temperature at this time, 100 to 138° C. is preferable considering a fusing point 139° C. when using the Sn—Bi solders 17a to 17c. Moreover, a pressure at the time of press fitting is 20 to 100 gf per electrode. Additionally, the holes 19a to 19c are vacuum-sucked from the lower surface side in order to prevent the Sn—Bi solders 17a to 17c and the ball aligning jig 18 itself from moving during press fitting.

Figure 7:
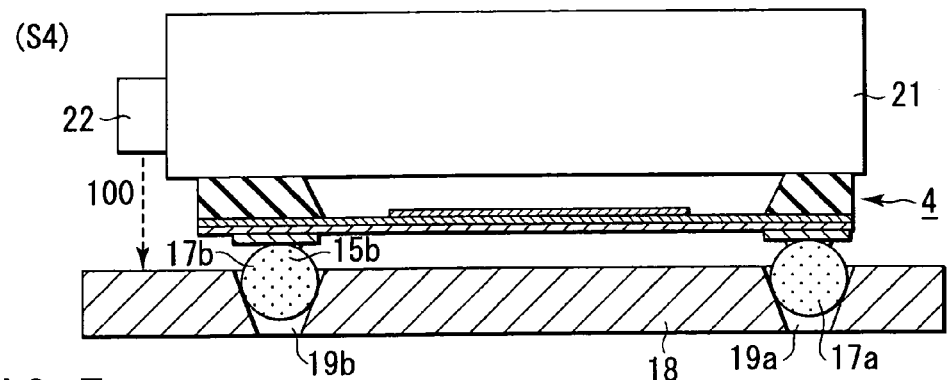
FIG. 7 is a view (part 4) illustrating the fabricating method according to the first embodiment of the present invention.

(S4) Press fitting advances as follows. The top portions of the Au bumps 15a to 15c are brought into contact with the surfaces of the Sn—Bi solders 17a to 17c. Plastic deformation starts from the contact parts of the Sn—Bi solders 17a to 17c in accordance with shapes of the top portions of the protruding electrodes (Au bumps 15a to 15c). An oxidized coating is destroyed during plastic deformation, new surfaces of the Sn—Bi solders 17a to 17c and new surfaces of the Au-bumps 15a to 15c are brought into contact with each other and solid-phase-diffused, and they are mechanically/electrically connected with each other (FIG. 7).

(S5) After completion of press fitting, the vacuum suction relative to the holes 19a to 19c from the lower surface is released, the MEMS board 4 is lifted up in the vertical direction together with the pressure welding head 21, and the Sn—Bi solders 17a to 17c are disconnected from the ball aligning jig 18. Then, the pressure welding head 21 is moved in the horizontal direction in such a manner that the Au bumps 16a to 16c on the circuit board 6 are opposite to the Sn—Bi solders 17a to 17c on the MEMS board 4.

Figure 8:
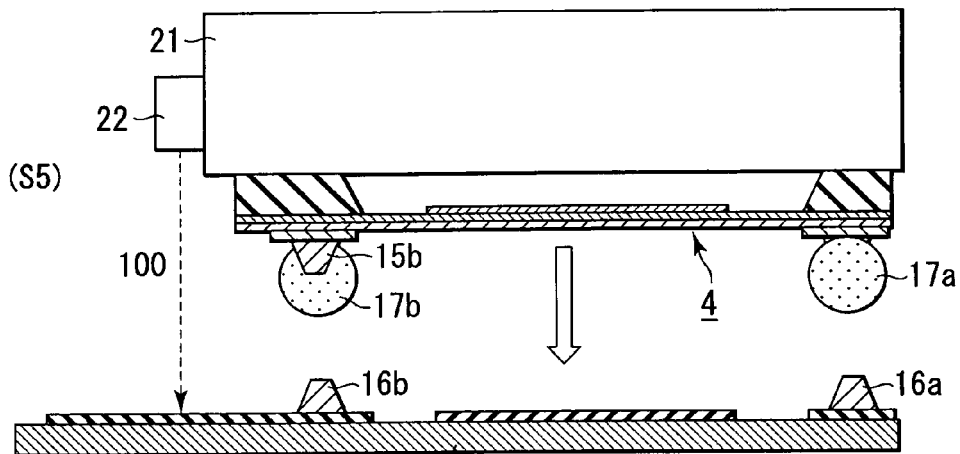
FIG. 8 is a view (part 5) illustrating the fabricating method according to the first embodiment of the present invention.

Subsequently, as shown in FIG. 8, the pressure welding head 21 is vertically moved down, and an operation to press-fit the Au bumps 16a to 16c to the Sn—Bi solders 17a to 17c is started. At this time, a quantity to press-fit the Au bumps 16a to 16c to the Sn—Bi solders 17a to 17c is controlled by a detection of the distance between the upper surface of the circuit board 6 and the pressure welding head 21 by using the length measuring sensor 22.

Before press-fitting the Sn—Bi solders 17a to 17c to the Au bumps 16a to 16c, either the Au bumps 16a to 16c or the Sn—Bi solders 17a to 17c are preheated to a temperature which enables the solid phase diffusion connection. In the heating method, a ceramic heater (not shown) is set on the pressure welding head 21 or in a base (not shown), and indirect heating is performed through the MEMS board 4 or the circuit board 6.

The preheating temperature at this time is 100 to 138° C. considering a fusing point 139° C. when using the Sn—Bi solders 17a to 17c, and a pressure when performing press fitting is 20 to 100 gf per electrode.

Figure 9:
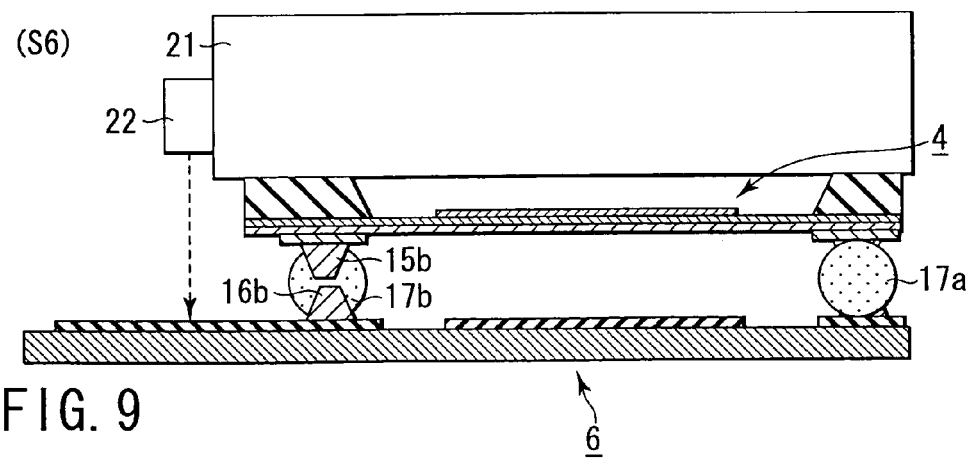
FIG. 9 is a view (part 6) illustrating the fabricating method according to the first embodiment of the present invention.

(S6) Press fitting advances as follows. The top portions of the Au bumps 16a to 16c come into contact with the surfaces of the Sn—Bi solders 17a to 17c. Plastic deformation starts from the contact parts of the Sn—Bi solders 17a to 17c in accordance with the shapes of the top portions of the Au bumps 16a to 16c. The oxidized coating is destroyed during plastic deformation, new surfaces of the Sn—Bi solders 17a to 17c and new surfaces of the Au bumps 16a to 16c are brought into contact with each other/solid-phase-diffused, and they are mechanically/electrically connected with each other (FIG. 9).

In the fabricating method according to the first embodiment, the Au bumps 15a to 15c of the MEMS board 4 and the Sn—Bi solders 17a to 17c are first solid-phase-diffusion-connected, and the Au bumps 16a to 16c of the circuit board 6 and the Sn—Bi solders 17a to 17c are solid-phase-diffusion-connected in a later step. However, these steps may be carried out in reverse order. Additionally, manufacture is performed in the atmosphere in the first embodiment, but it may be effected in a vacuum or an inert gas such as Ar gas.

(Advantages)

The bump portions which electrically/mechanically support a gap between the electrode pads 11a to 11c of the MEMS board 4 and the connection pads 12a to 12b of the circuit board 6 achieve the solid phase diffusion connection by using the Sn—Bi solders 17a to 17 and the entire peripheral surfaces of the Au bumps 15a to 15c and the Au bumps 16a to 16c, and hence there is an advantage that a mechanical strength of the bump connection portions can be improved.

Further, the first embodiment has the following inherent advantage in addition to the above advantage. That is, since the Au bumps 15a to 15c and the Au bumps 16a to 16c are not directly brought into contact with each other, a gap quantity between the MEMS board 4 and the circuit board 6 can be freely largely assured. As a result, a flip chip connection with a high gap quantity is enabled.

[Second Embodiment]

A second embodiment according to the present invention is an application to a semiconductor apparatus which flip-chip-connects an optical semi-conductor chip having a photodetector with a glass substrate.

(Structure)

Figure 10:
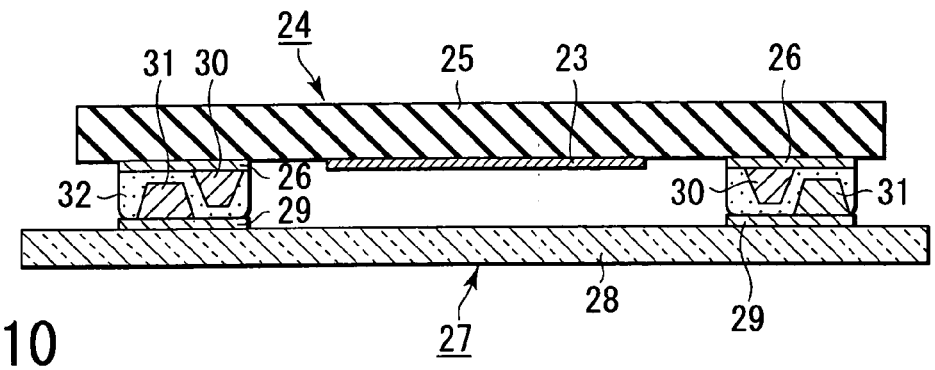
FIG. 10 is a view illustrating a structure of a second embodiment according to the present invention.

FIG. 10 is a view illustrating a structure of a second embodiment according to the present invention. The second embodiment has the following structure. An optical semiconductor chip 24 comprises a silicon substrate 25, a photodetector 23 provided at a central portion of a lower surface of this silicon substrate 25, and an Al electrode pad 26 electrically connected with this photodetector 23 through a wiring.

On the other hand, the glass substrate 27 comprises a glass substrate 28, an Al connection pad 29 and an external terminal (not shown). The connection pad is arranged at a position opposite to the electrode pad 26 of the optical semiconductor chip 24. The external connection terminal is electrically connected with the connection pad 29 through a wiring.

An Au bumps 30 and an Au bump 31 are provided on one surface of the electrode pad 26 of the optical semiconductor chip 24 and one surface of the connection pad 29 of the glass substrate 27 by the stud bump method. Each of the Au bumps 30 and 31 has a conical shape with a bottom portion diameter of 60 to 100 μm, a top portion diameter of 20 to 50 μm and a height of 15 to 60 μm. The Au bump 30 and the Au bump 31 are arranged at position where they are not opposite to each other, and solid phase diffusion connection is achieved on the entire peripheral surfaces of an Al alloy 32 and the Au bumps 30 and 31.

Figure 15:
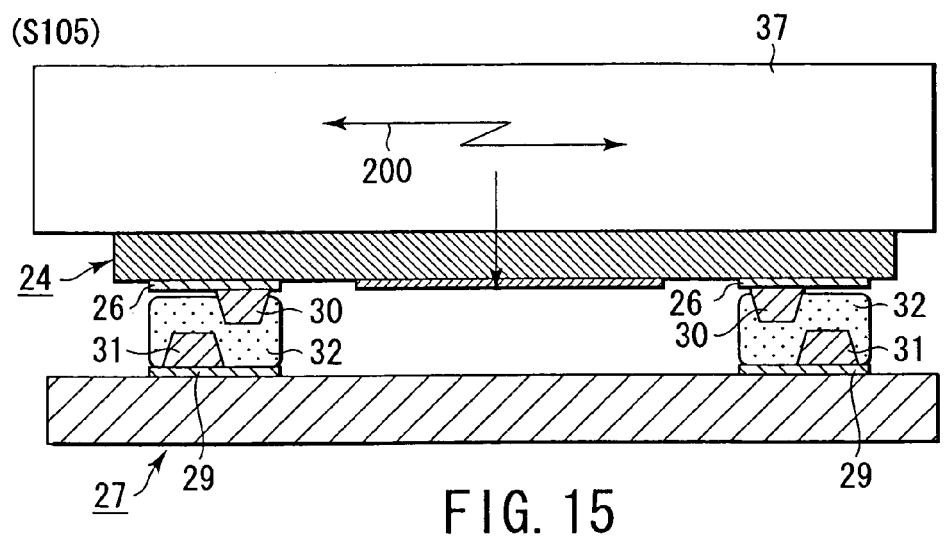
FIG. 15 is a view (part 5) illustrating the fabricating method according to the second embodiment of the present invention.

A fabricating method according to the second embodiment will now be described with reference to FIGS. 11 and 15. In the drawings, (S101) to (S105) denote respective manufacturing steps.

Figure 11:
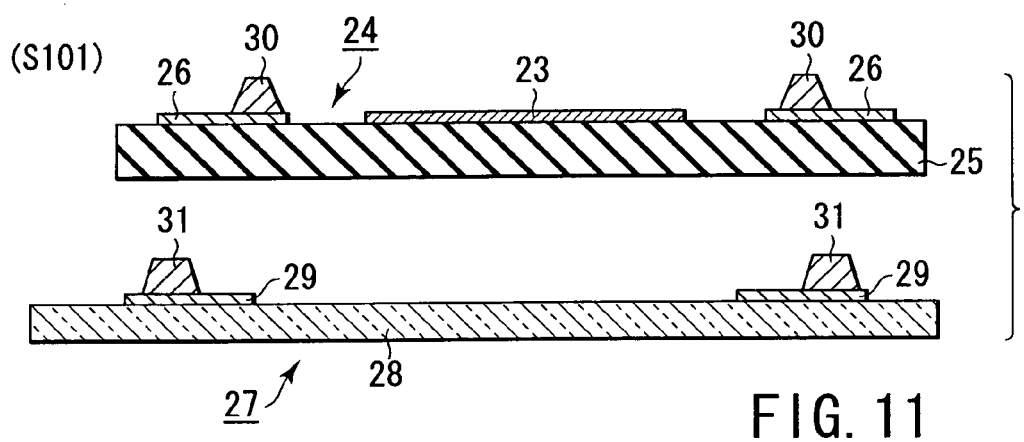
FIG. 11 is a view (part 1) illustrating a fabricating method according to the second embodiment of the present invention.

(S101) First, as shown in FIG. 11, the Au bump 30 is formed on the electrode pad 26 of the optical semiconductor chip 24. Further, the Au bump 31 is formed on the connection pad 29 of the glass substrate 27.

Figure 12:
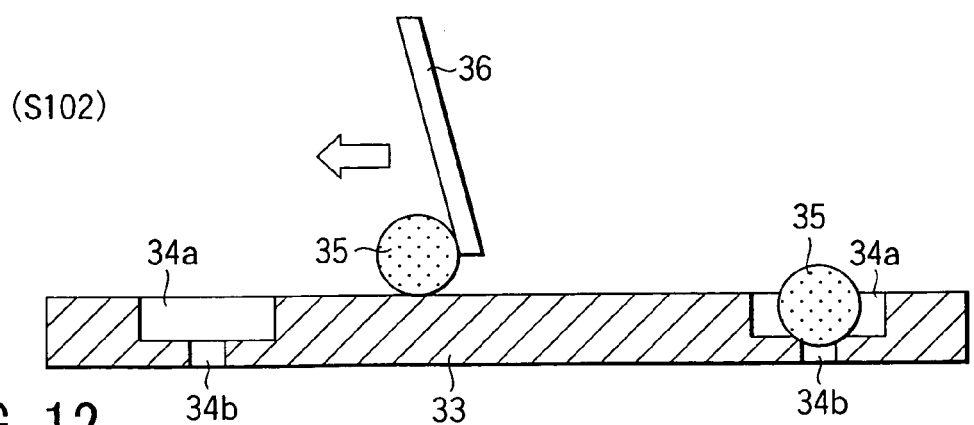
FIG. 12 is a view (part 2) illustrating the fabricating method according to the second embodiment of the present invention.
Figure 13:
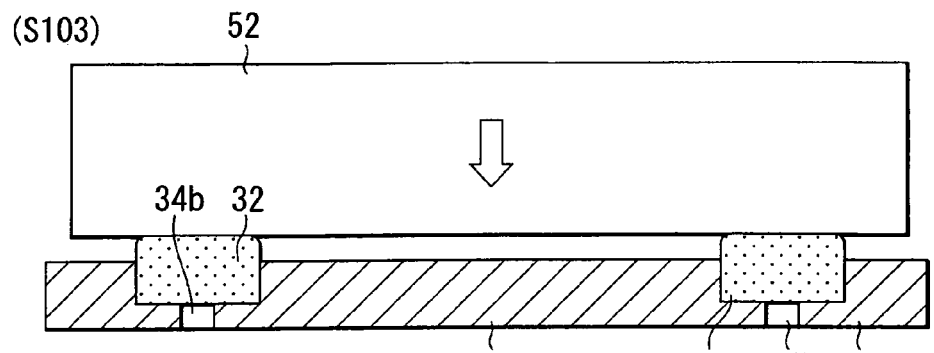
FIG. 13 is a view (part 3) illustrating the fabricating method according to the second embodiment of the present invention.

(S102) Then, as shown in FIG. 12, an Al metal squeegee 36 is moved in the horizontal direction, and an Al ball 35 having a diameter of 100 to 200 μm is aligned/arranged in a hole 34a of a ball aligning jig 33.

(S103) Then, a hole 34b of the ball aligning jig 33 is vacuum-sucked from the lower surface, and the Al ball 35 is fixed. Thereafter, pressing is performed by using a leveling plate 52, and the Al ball 35 is molded to a cylindrical Al alloy 32 (FIG. 32).

(S104) A glass substrate 27 having the Au bump 31 formed on the connection pad 29 is sucked and held to a pressure welding head 37, and then the pressure welding head 37 is moved in the horizontal direction in such a manner that the Al alloy 32 on the ball aligning jig 33 is opposite to the connection pad 29 of the glass substrate 27.

Figure 14:
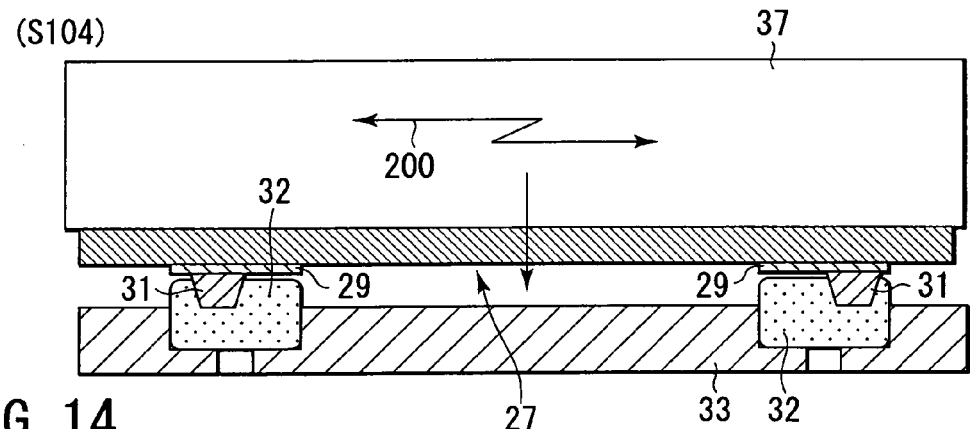
FIG. 14 is a view (part 4) illustrating the fabricating method according to the second embodiment of the present invention.

Then, as shown in FIG. 14, the pressure welding head 37 is vertically moved down, and the Au bump 31 is brought into contact with the Al alloy 32. Thereafter, ultrasonic vibrations 200 are given in the horizontal direction while applying a pressure in the vertical direction. As a result, the Au bump 31 is press-fitted to the Al alloy 32, and a new surface of the Al alloy 32 a plastic-deformed metal electrode and a new surface of the Au bump 31 as are brought into contact with each other, thereby completing the solid phase diffusion connection. Furthermore, the solid phase diffusion connection is completed with respect to the connection pad 29 except a part where the Au bump 31 is formed and the peripheral surface of the Al alloy 32 at the same time.

(S105) Then, after the glass substrate 27 to which the Au bump 31 and the Al alloy 32 are solid-phase-diffusion-connected is fixed on a base (not shown), the optical semiconductor chip 24 having the Au bump 30 formed on the electrode pad 26 is sucked and held to the pressure welding head 37.

Subsequently, the pressure welding head 37 is vertically moved down, and the Au bump 30 and the Al alloy 32 are brought into contact with each other. Thereafter, ultrasonic vibrations 200 are given in the horizontal direction while applying a pressure in the vertical direction. As a result, the Au bump 30 is press-fitted to the Al alloy 32, and a new surface of the plastic-deformed Al alloy 32 and the new surface of the Au bump 30 are brought into contact with each other, thereby completing the solid phase diffusion connection. Moreover, the solid phase diffusion connection is completed with respect to the connection pad 26 except a part where the Au bump 30 is formed and the peripheral surface of the Al alloy 32 at the same time (FIG. 15).

(Advantages)

In regard to the bump portion which electrically/mechanically supports between the electrode pad 26 of the optical semiconductor chip 24 and the connection pad 29 of the glass substrate 27, in the first place, the entire peripheral surfaces of the Al alloy 32, the Au bump 30 and the Au bump 31 are solid-phase-diffusion-connected. In the second place, the peripheral surface of the Al alloy 32 and the electrode pad 26 are solid-phase-diffused. In the third place, the peripheral surface of the Al alloy 32 and the connection pad are respectively solid-phase-diffusion-connected. Therefore, there is an advantage that the mechanical strength of the bump portion is improved.

The second embodiment has the following inherent advantage as well as the above-described advantage. That is, since the Au bump 30 and the Au bump 31 are not opposite to each other, a gap quantity between the optical semiconductor chip 24 and the glass substrate 27 can be reduced. Additionally, since the solid phase diffusion connection is achieved at parts other than the peripheral surfaces of the Al alloy 32 and the Au bumps 30 and 31, the connection strength is improved at the maximum level. Further, since packaging can be attained without increasing a temperature, components which have a weakness for heat can be mounted. Furthermore, an area of the electrode pad can be increased.

[Third Embodiment]

A third embodiment according to the present invention is an application to an example that an electrostatic drive type device is packaged by flip-chip connecting an MEMS board having a movable portion in a large part of the substrate with a circuit board having a drive electrode corresponding to the movable portion.

(Structure)

Figure 16:
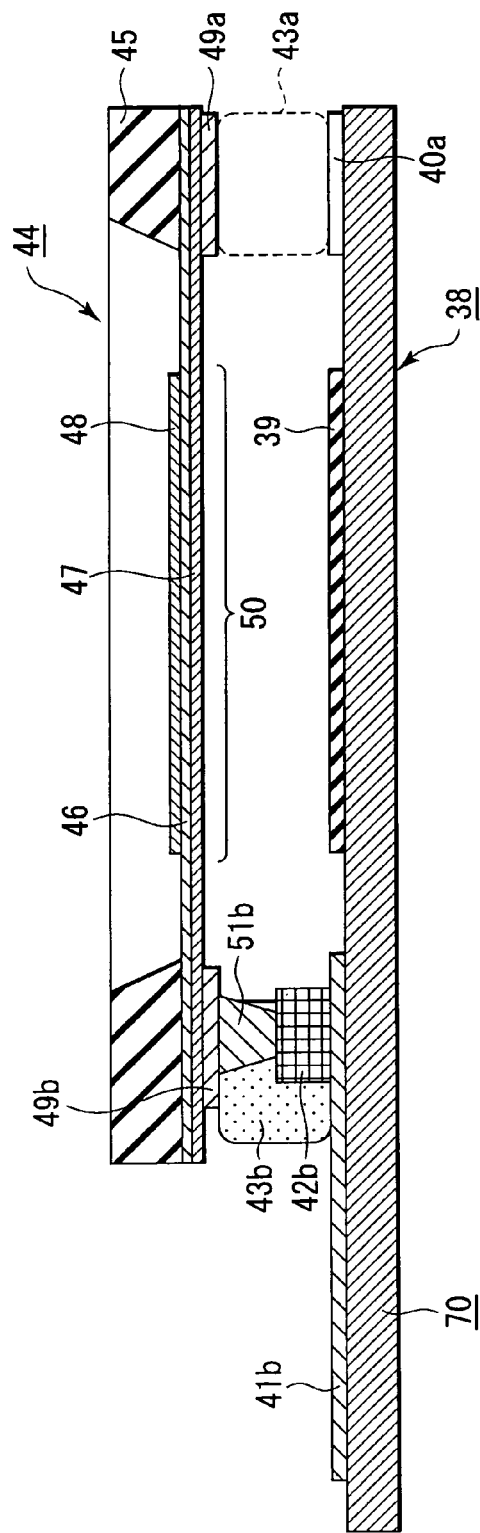
FIG. 16 is a view (part 1) illustrating a structure of a third embodiment according to the present invention.
Figure 17A:
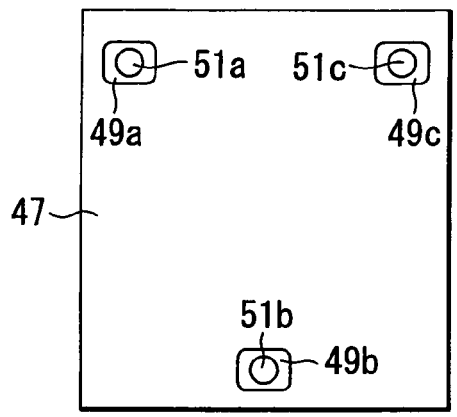
FIGS. 17A and 17B are views (part 2) illustrating the structure of the third embodiment of the present invention.
Figure 17B:
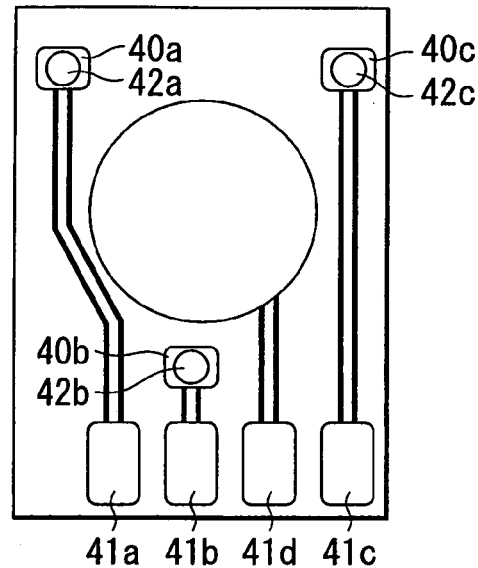
Figure 18:
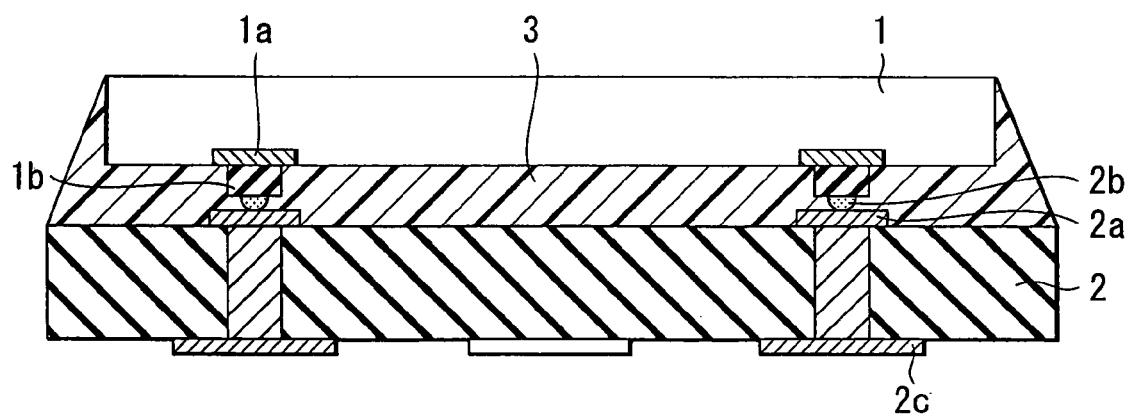
FIG. 18 is a view illustrating a structure of a conventional semiconductor apparatus.

FIGS. 16, 17A and 17B are views illustrating a structure of a third embodiment according to the present invention. The third embodiment has the following structure. An MEMS board 44 comprises a single-crystal silicon frame 45 having a central portion eliminated by etching, a polyimide thin film 46 and a Cr thin film 47 formed on an entire lower surface of this single-crystal silicon frame 45, an Al reflection film 48 circularly formed on the polyimide thin film 46, and Au electrode pads 49a, 49b and 49c formed at three positions directly below the frame of the Cr thin film 47. A movable portion 50 bends toward the circuit board 38.

On the other hand, the circuit board 38 comprises a substrate 70, an Al drive electrode 39 formed at a position opposite to the Al reflection film 48, Al connection pads 40a, 40b and 40c formed at positions opposite to the electrode pads 49a, 49b and 49c, and external connection terminals 41a to 41d electrically connected with the drive electrode 39 and the connection pads 40a to 40c through wirings. The respective elements are all provided on an upper surface of the substrate 70.

Au bumps 5a to 51c are provided on the electrode pads 49a to 49c on the MEMS board 44 and Ni bumps 42a to 42c are provided on the connection pads 40a to 40c on the circuit board 38 by a plating method so as to have an uniform height. The Au bumps 51a to 51c all have the same conical shape. In regard to a size of each Au bump, a bottom surface diameter is 60 to 100 μm, a top surface diameter is 20 to 50 μm, and a height is 15 to 60 μm.

The heights of the Au bumps 51a to 51c are uniformed between 15 to 60 μm by using a leveling jig (not shown). The Ni bumps 42a to 42c all have the same cylindrical shape and have diameters not less than the top surface diameters of the Au bumps 51a to 51c.

Sn—Zn solders, 43a to 43c integrally cover the Au bumps 51a to 51c and the Ni bumps 42a to 42c, form an alloy layer by using the peripheral surfaces of the respective bumps 51a to 51c and 42a to 42c and the solid phase diffusion connection, and achieve mechanical/electrical connection. In regard to a composition of the Sn—Zn solders 43a to 43c, Sn is 91% and Zn is 9%. They have a bulk modulus lower than those of the Au bumps 51a to 51c and the Ni bumps 42a to 42c, and they are readily plastic-deformed.

(Effects/Advantages)

Effects of the embodiment according to the present invention will now be described. In regard to the bump portions which electrically/mechanically support between the electrode pads 49a to 49c of the MEMS board 44 and the connection pads 40a to 40b of the circuit board 38, the top surfaces of the Au bumps 51a to 51c are brought into contact with the top surfaces of the Ni bumps 42a to 42c, thereby maintaining a gap quantity between the boards to a sum of the Au bump heights and the Ni bump heights. The Sn—Zn solders 43a to 43c achieve the solid phase diffusion connection on the entire side surfaces of the Au bumps 51a to 51c and the Ni bumps 42a to 42c, which provide an advantage to improve the mechanical strength of the bump portions.

Further, the third embodiment has the following inherent advantage as well as the above described advantage. That is, the Au bumps 51a to 51c having the uniform height and the Ni bumps 42a to 42c can be used to maintain the gap quantity between the boards. As a result, the element can be mounted irrespective of a resolution of a positional control of the pressure welding head in the vertical direction, and hence expensive facilities do not have to be used.

According to the present invention, since the solid phase diffusion connection with the electro-conductive connection members is achieved by using the entire peripheral surfaces of both the first and second protruding electrodes, a connection area can be greatly reduced. As a result, the mechanical strength between the protruding elements can be improved.

Furthermore, according to the present invention, an application to the packaging of the optical semiconductor chip in which resin sealing is difficult or the MEMS board having the mechanical drive portion is enabled. Moreover, there is an advantage that the packaging is possible without destroying a fragile MEMS board such as a hinge or a thin film, a very thin semiconductor chip and a circuit board.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor apparatus, in which a semiconductor chip having electrode pads is mounted on a circuit board having connection pads, with the electrode pads being respectively bonded through bumps to the connection pads wherein at least one of the bumps comprises:
   a first protruding electrode provided on one or more of the electrode pads;
   a second protruding electrode provided on one or more of the connection pads; and
   an electroconductive connection member which integrally covers peripheral surfaces of the first and second protruding electrodes and solid-phase-diffusion-connects the first and second protruding electrodes.

2. The semiconductor apparatus according to claim 1, wherein a bulk modulus of the connection member is smaller than a bulk modulus of each of the first and second protruding electrodes.

3. The semiconductor apparatus according to claim 2, wherein the connection member solid-phase-diffusion-connects the first and second protruding electrodes together with the electrode pad and the connection pad.

4. The semiconductor apparatus according to claim 2, wherein the first protruding electrode is not opposite to the second protruding electrode.

5. The semiconductor apparatus according to claim 2, wherein a top portion of the first protruding electrode is opposite to and in contact with a top portion of the second protruding electrode.

6. The semiconductor apparatus according to claim 2, wherein a connection surface of the connection member on which the first and second protruding electrodes are connected has a flat shape.

7. The semiconductor apparatus according to claim 1, wherein the connection member solid-phase-diffusion-connects the first and second protruding electrodes together with the electrode pad and the connection pad.

8. The semiconductor apparatus according to claim 1, wherein the first protruding electrode is not opposite to the second protruding electrode.

9. The semiconductor apparatus according to claim 1, wherein a top portion of the first protruding electrode is opposite to and in contact with a top portion of the second protruding electrode.

10. The semiconductor apparatus according to claim 1, wherein a connection surface of the connection member on which the first and second protruding electrodes are connected has a flat shape.

11. A semiconductor apparatus, in which a semiconductor chip having electrode pads is mounted on a circuit board having a connection pad at a position opposite to each of the electrode pads, with the electrode pads being respectively bonded through bumps to the connection pads, wherein at least one of the bumps comprises:
   a first protruding electrode provided on one or more of the electrode pads;
   a second protruding electrode provided on one or more of the connection pads; and
   electroconductive connecting means for integrally covering the first and second protruding electrodes and solid-phase-diffusion-connecting the first and second protruding electrodes.

12. The semiconductor apparatus according to claim 11, wherein a bulk modulus of the connecting means is smaller than a bulk modulus of each of the first and second protruding electrodes.

13. The semiconductor apparatus according to claim 11, wherein the connecting means solid-phase-diffusion-connects the first and second protruding electrodes together with the electrode pad and the connection pad.

14. The semiconductor apparatus according to claim 11, wherein the first protruding electrode is not opposite to the second protruding electrode.

15. The semiconductor apparatus according to claim 11, wherein a top portion of the first protruding electrode is opposite to and in contact with a top portion of the second protruding electrode.

16. The semiconductor apparatus according to claim 11, wherein a connection surface of the connecting means on which the first and second protruding electrodes are connected has a flat shape.

* * * * *